US011657191B2

(12) United States Patent
Jalla

(10) Patent No.: US 11,657,191 B2
(45) Date of Patent: *May 23, 2023

(54) METHOD AND SYSTEM FOR IDENTIFYING EXTERNAL CONFLICTS WITH A ROOF TRUSS ASSEMBLY

(71) Applicant: Consulting Engineers, Corp., Reston, VA (US)

(72) Inventor: Maharaj Jalla, Great Falls, VA (US)

(*) Notice: Subject to any disclaimer, the term of this patent is extended or adjusted under 35 U.S.C. 154(b) by 456 days.

This patent is subject to a terminal disclaimer.

(21) Appl. No.: 16/802,625

(22) Filed: Feb. 27, 2020

(65) Prior Publication Data

US 2021/0141953 A1 May 13, 2021

Related U.S. Application Data

(63) Continuation-in-part of application No. 16/677,639, filed on Nov. 7, 2019, now Pat. No. 11,113,310.

(51) Int. Cl.
*G06F 30/13* (2020.01)
*G06T 19/20* (2011.01)

(52) U.S. Cl.
CPC .............. *G06F 30/13* (2020.01); *G06T 19/20* (2013.01); *G06T 2219/2004* (2013.01)

(58) Field of Classification Search
CPC .. G06F 30/13; G06T 19/20; G06T 2219/2004
See application file for complete search history.

(56) References Cited

U.S. PATENT DOCUMENTS

| 8,732,599 | B2* | 5/2014 | Reghetti | G06T 19/20 |
| | | | | 715/765 |
| 2004/0073410 | A1* | 4/2004 | Maly | G06F 30/13 |
| | | | | 703/1 |
| 2007/0213960 | A1* | 9/2007 | Freet | E04B 7/22 |
| | | | | 703/1 |
| 2008/0249749 | A1* | 10/2008 | Egbertson | G06F 30/13 |
| | | | | 703/1 |
| 2010/0024318 | A1* | 2/2010 | Zhang | G06F 30/13 |
| | | | | 52/79.5 |
| 2015/0254376 | A1* | 9/2015 | Pettersson | G06F 30/13 |
| | | | | 703/1 |

* cited by examiner

*Primary Examiner* — Chuen-Meei Gan
(74) *Attorney, Agent, or Firm* — Andrew Morabito

(57) ABSTRACT

A computer program product comprising: accessing a model of a building, wherein the model is comprised of a plurality of assemblies, wherein the assemblies are comprised of a plurality of members; detecting the assemblies which are identified as roof trusses, wherein the roof truss is identified by the specific members and member internal interfaces and the member properties; analyzing the roof trusses to determine if a roof truss has an external interface with another roof truss; isolating the roof trusses and the plurality of members; and analyzing each of the members of the roof trusses which have external interfaces with other members, wherein the interface is analyzed to determine if the interface is conflicting, wherein a conflicting interface is one where the actual values of the members are inconsistent with a required value.

14 Claims, 12 Drawing Sheets

METHOD AND SYSTEM FOR IDENTIFYING EXTERNAL CONFLICTS WITH A ROOF TRUSS ASSEMBLY

CROSS-REFERENCE TO RELATED APPLICATIONS

This application is a continuation-in-part (and claims the benefit of priority under 35 USC 120) of U.S. Pat. No. 1,113,310 issues on Sep. 7, 2021. The disclosure of the applications U.S. Pat. No. 1,113,310 is considered part of (and is incorporated by reference in) the disclosure of this application.

BACKGROUND

This disclosure relates generally to building construction and in particular, to the method, computer program, or computer system for providing the quality control of the material for the building construction and determining conflicts within the building construction.

A typical building or structure is comprised of having different components like foundation, walls, joists, trusses, sheathings, and many other components. When these components are connect with each other in a proper form, the structure or building is constructed correctly. Each individual component is used to form a larger assembly or panel. If each component is not the correct specification or dimensions then it leads to conflicts in the assembly process. This results in lost of time, wasted material, and an increase in cost. For example, when constructing roof trusses, conflicts between the members of the panel can occur in overlapping of the members, wrong placing of dimples locations, insufficient overlap length, and overlap width. Checking each individual member and panel is very time consuming and critical task for the engineer.

During the building construction, the connections and placing of each roof trusses is important for a hassle and conflict free construction. The constructability of the roof trusses is also important to avoid any conflict between any disciplines is critical aspect. Traditional method of reviewing the constructability checks for each individual roof truss member panel manually in the detailing software is time consuming and chances of error are more.

Therefore, it is beneficial to asses each of the roof trusses during the modeling process to identify where issues exist and provide solutions to these issues.

SUMMARY

In a first embodiment, the present invention is a computer implemented method comprising: accessing, by at least one processor, a model of a building, wherein the model is comprised of a plurality of assemblies, wherein the assemblies are comprised of a plurality of members; detecting, by at least one processor, the assemblies which are identified as roof trusses, wherein the roof truss is identified by the specific members and member internal interfaces and the member properties; analyzing, by at least one processor, the roof trusses to determine if a roof truss has an external interface with another roof truss; isolating, by at least one processor, the roof trusses and the plurality of members; analyzing, by at least one processor, each of the members of the roof trusses which have external interfaces with other members, wherein the interface is analyzed to determine if the interface is conflicting, wherein a conflicting interface is one where the actual values of the members are inconsistent with a required value; modifying, by at least one processor, the members involved in the conflicting interface; and identifying, by at least one processor, the members involved in the conflicting interface, the type of conflict, and the modification of the member involved in the conflict.

In a second embodiment, the present invention is a computer program product comprising: a computer readable storage device readable by one or more processing circuit and storing instructions for execution by one or more processor for performing a method comprising: accessing a model of a building, wherein the model is comprised of a plurality of assemblies, wherein the assemblies are comprised of a plurality of members; detecting the assemblies which are identified as roof trusses, wherein the roof truss is identified by the specific members and member internal interfaces and the member properties; analyzing the roof trusses to determine if a roof truss has an external interface with another roof truss; isolating the roof trusses and the plurality of members; and analyzing each of the members of the roof trusses which have external interfaces with other members, wherein the interface is analyzed to determine if the interface is conflicting, wherein a conflicting interface is one where the actual values of the members are inconsistent with a required value.

In a third embodiment, the present invention is a system comprising: a memory; one or more processors in communication with the memory; program instructions executable by the one or more processors via the memory to perform a method, the method comprising: a computer readable storage device readable by one or more processing circuit and storing instructions for execution by one or more processor for performing a method comprising: accessing a model of a building, wherein the model is comprised of a plurality of assemblies, wherein the assemblies are comprised of a plurality of members; detecting the assemblies which are identified as roof trusses, wherein the roof truss is identified by the specific members and member internal interfaces and the member properties; analyzing the roof trusses to determine if a roof truss has an external interface with another roof truss; isolating the roof trusses and the plurality of members; and analyzing each of the members of the roof trusses which have external interfaces with other members, wherein the interface is analyzed to determine if the interface is conflicting, wherein a conflicting interface is one where the actual values of the members are inconsistent with a required value.

BRIEF DESCRIPTION OF THE DRAWINGS

Referring now to the drawings in which like reference numbers represent corresponding parts throughout.

DETAILED DESCRIPTION

Figure 1:
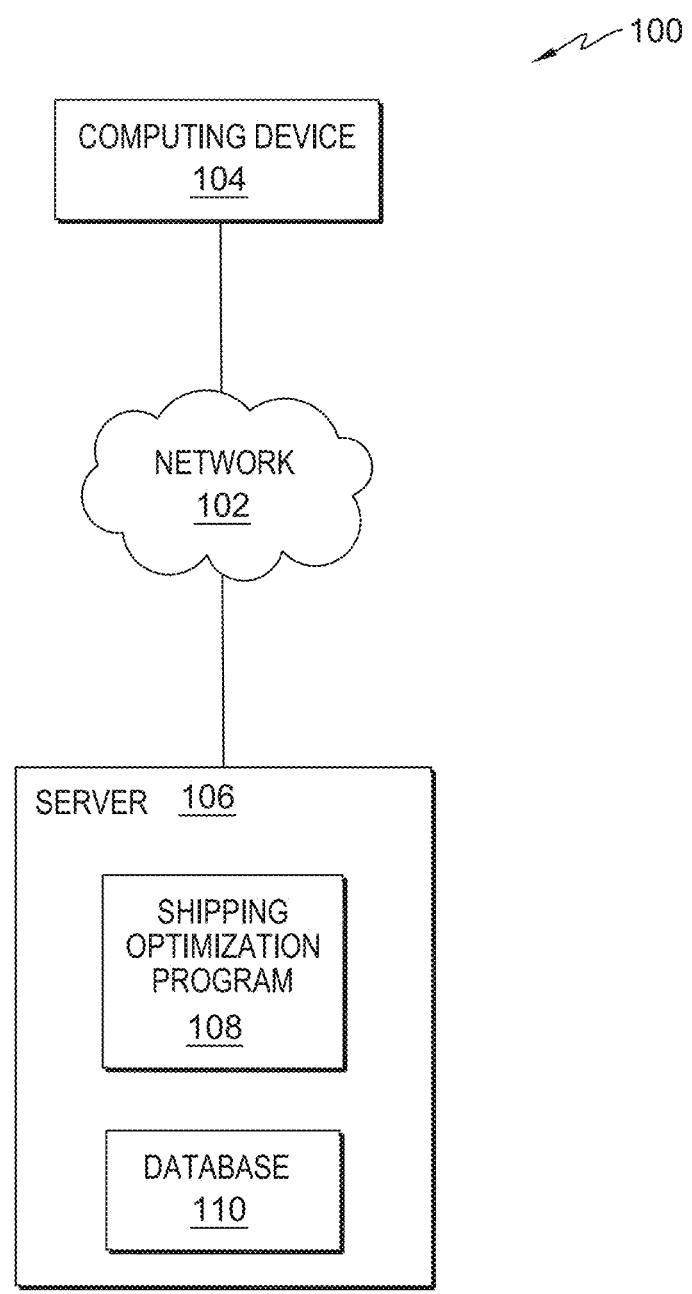
FIG. 1 depicts a block diagram depicting a computing environment, in accordance with one embodiment of the present invention.

The present invention generally relates to the process of analyzing a building to identify conflicts or design errors, and correcting the errors at the design stage so the construction can be completed with minimal or no issues. Through the location of the roof trusses, the identification of the roof truss members, and the analysis of the roof truss members to determine if they have the correct properties and if they are outside of the tolerance values, correcting the errors with the roof truss members.

The present invention uses the unique feature of analyzing the roof truss members and determining if there are any internal or external conflicts. The internal conflicts are related to the features (length, height, width, openings, cutouts, etc.) of the roof truss members, where the external conflicts are related to the interaction and placement between members of the same roof truss. In instances where conflicts are identified the roof truss member(s) are added to a sick list, which identifies the type of conflict. The unique feature saves the time of review the building manually and eliminate the chance of error with the construction process.

In the typical construction process a model of the building (e.g. structure, home, office building, hospital, garage, barn, apartment building, etc.) is created. This model is comprised of all the members which form the frame of the building. The members form assemblies (e.g. panels, joists, trusses, etc.) which them form the walls, floors, and roof. The next step is to generate the manufacturing files for the roll forming machine to produce these members to the design specifications. However, the generation of these manufacturing files is not advised or able to be completed until a verification of possible conflicts of the roof truss systems is completed.

Otherwise the potential for cold formed steel members to be manufactured without the proper measurements, cutouts or designs elements. This will require the remanufacturing of the members, or manual modification of the parts need to be completed on the job site. Both of these take time and additional resources to complete. The reviewing of the model from constructability aspect and identify the possible conflicts is a time consuming task before the roof truss members are manufactured. If the user is able to quickly identify the conflicts in the model, the entire process of constructing the building can be shortened.

The reviewing of the 3D model from constructability aspect and identify the possible conflicts in the roof trusses is one of the major time consuming task. If the user is able to quickly check and identify the possible conflicts, they can increase the speed of manufacturing, and having a program that highlights these conflicts only further increases the speed at which the project can be completed.

The present invention provides for an advantage of allowing the review of the drawings or models by providing a unique process of identifying internal and external conflicts with the roof truss members. The individual members of the roof truss which are conflicting are identified and marked for the reviewer to easily identify and correct the conflicts. The conflicts can be identified during the process of building detailing by using the present inventions conflict check method and system.

The term "conflict" is used for any incidence which results in the member or the interaction between members to be outside of a predetermined tolerance of acceptable values. This can be based on state, federal or local building codes, manufacturing machine limitations, or inconsistencies or inaccuracies with the model or drawings. For example, if a member is not at the required position, not within the required specifications, not adhering to predetermined codes, or the like a conflict may be present. Required position means the Global position of the member in reference to the modeling software x, y, and z, axes. In another embodiment, the properties of the member may be impossible to manufacture based on the cold formed steel construction tolling operation limitations The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

FIG. 1 depicts a block diagram of a computing environment 100 in accordance with one embodiment of the present invention. FIG. 1 provides an illustration of one embodiment and does not imply any limitations regarding the environment in which different embodiments maybe implemented.

In the depicted embodiment, computing environment 100 includes network 102, computing device 104, and server 106. Computing environment 100 may include additional servers, computers, or other devices not shown.

Network 102 may be a local area network (LAN), a wide area network (WAN) such as the Internet, any combination thereof, or any combination of connections and protocols that can support communications between computing device 104 and server 106 in accordance with embodiments of the invention. Network 102 may include wired, wireless, or fiber optic connections.

Computing device 104 may be a management server, a web server, or any other electronic device or computing system capable of processing program instructions and receiving and sending data. In other embodiments, computing device 104 may be a laptop computer, tablet computer, net book computer, personal computer (PC), a desktop computer, or any programmable electronic device capable of communicating with patient computing device 104 via network 102. In other embodiments, computing device 104 may be a server computing system utilizing multiple computers as a server system, such as in a cloud computing environment. In one embodiment, computing device 104 represents a computing system utilizing clustered computers and components to act as a single pool of seamless resources. Computing device 104 may include components, as depicted and described in further detail with respect to FIG. 1.

Server 106 may be a management server, a web server, or any other electronic device or computing system capable of processing program instructions and receiving and sending data. In other embodiments server 106 may be a laptop computer, tablet computer, net book computer, personal computer (PC), a desktop computer, or any programmable electronic device capable of communicating via network 102. In one embodiment, server 106 may be a server computing system utilizing multiple computers as a server system, such as in a cloud computing environment. In one embodiment, server 106 represents a computing system utilizing clustered computers and components to act as a single pool of seamless resources. In the depicted embodiment conflict identification program 108 and database 110 are located on server 106. Server 106 may include components, as depicted and described in further detail with respect to FIG. 1.

Conflict Identification program 108 has the unique feature of identifying internal and external conflicts within roof truss members through an analysis of the actual measurements or properties compared with the required measurements and properties. The conflict identification program 108 is able to identify the member or members involved in the conflict and provide a visual identifier as to the members involved. The conflict identification program 108 is able to constantly and continuously monitor the assemblies and the members to detect these conflicts.

The internal conflicts are related to the properties of the of the roof truss members. For example, the length, width, height, orientation, cutouts, dimples, openings, or the like. This also includes the position of the member within the model relative to the x, y, and z axes. This also includes how the roof truss members interact with other features or systems of the model, for example plumbing, electrical, HVAC, and the like. In some embodiments, the conflict identification program 108 accesses various building codes and laws of the state, local, or federal guidelines which are required to construct the building and applies these requirements.

An external conflict is related to the interaction between members of the assembly. This includes the junctions between the members, the placement of dimples or apertures where members overlap, the length of the overlap of members, the space between members, the fastening location and number of locations, and the like In the depicted embodiment, Conflict identification program 108 utilizes network 102 to access the computing device 104 and to communicate with database 110. In one embodiment, Conflict identification program 108 resides on computing device 104. In other embodiments, Conflict identification program 108 may be located on another server or computing device, provided Conflict identification program 108 has access to database 110.

Database 110 may be a repository that may be written to and/or read by Conflict identification program 108. Information gathered from computing device 104 and the 1-dimensional, 2-dimensional (2D), and 3D drawings and models as well as the requirements so that the materials and members are identified as conflicting or non-conflicting. In one embodiment, database 110 is a database management system (DBMS) used to allow the definition, creation, querying, update, and administration of a database(s). In the depicted embodiment, database 110 resides on computing device 104. In other embodiments, database 110 resides on another server, or another computing device, provided that database 110 is accessible to Conflict identification program 108.

Figure 2:
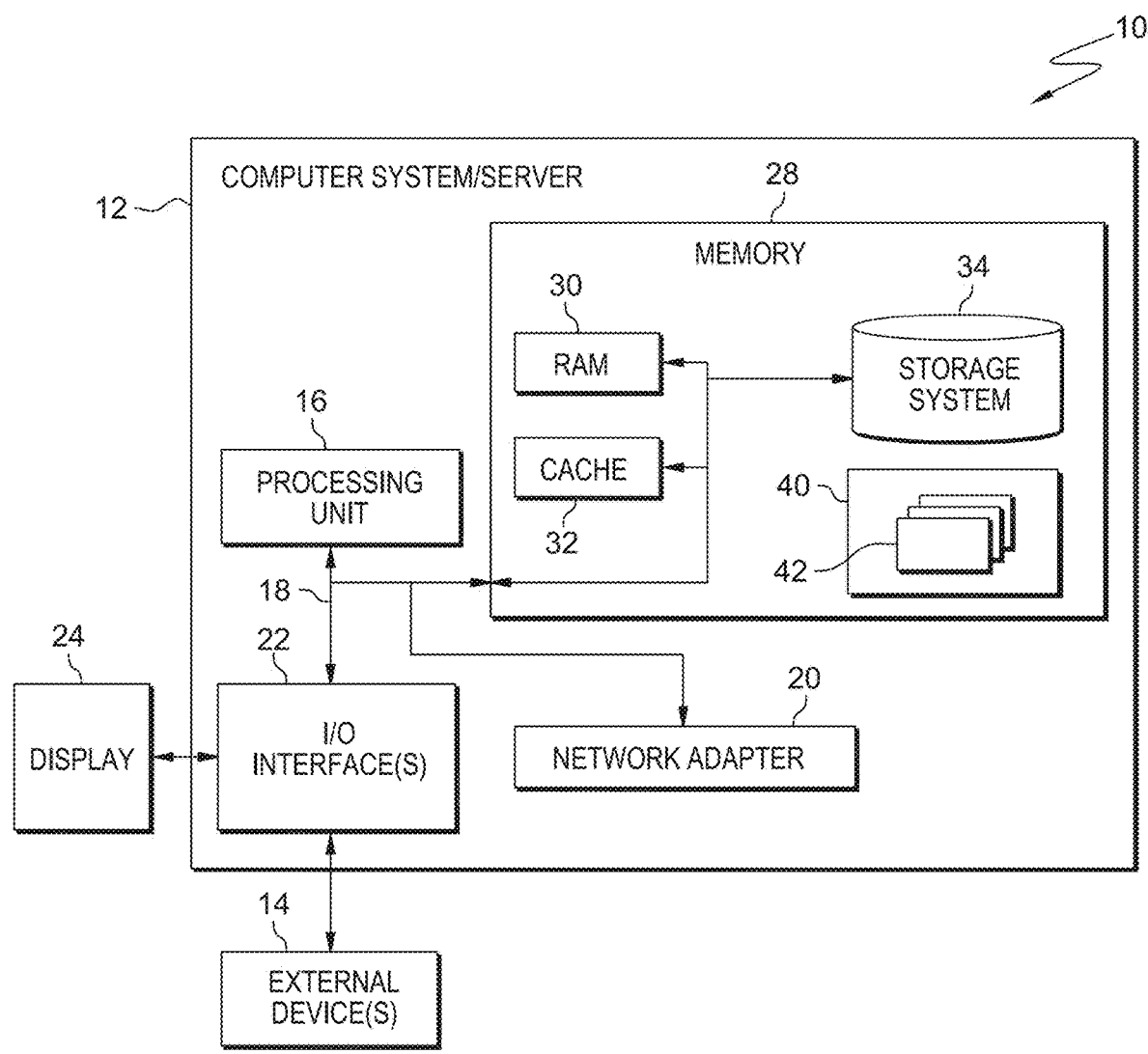
FIG. 2 depicts a block diagram depicting the internal and external components of the server and computing device of FIG. 1, in accordance with one embodiment of the present.

FIG. 2, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing environment 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

FIG. 2, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 3:
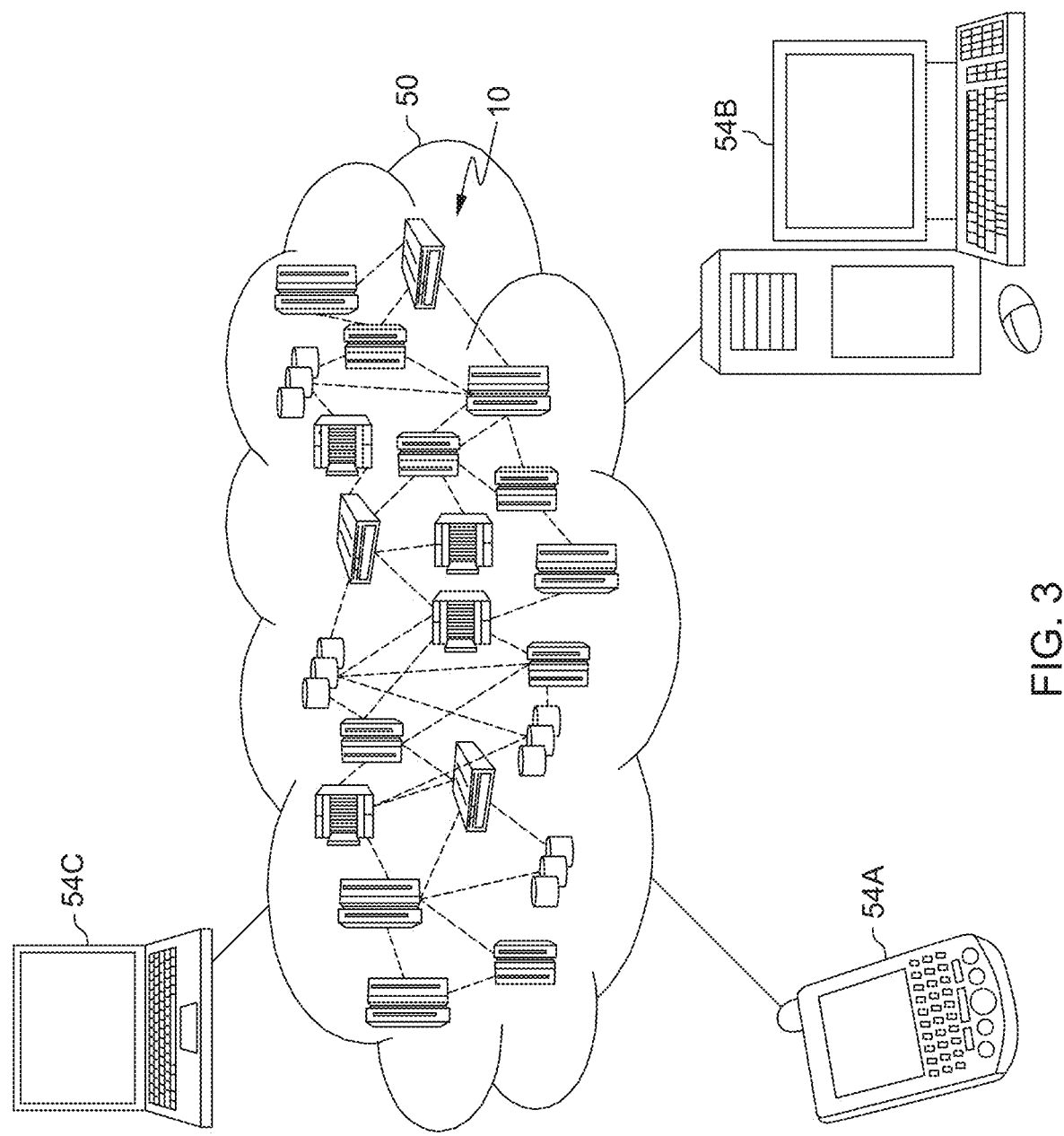
FIG. 3 depicts a cloud computing environment, in accordance with one embodiment of the present invention.

FIG. 3, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-C shown in FIG. 2 are intended to be illustrative only and that computing nodes 10 and cloud computing environment 50 can communicate with any type of computerized device over any type of network and/or network addressable connection (e.g., using a web browser).

Referring back to FIG. 2, the Program/utility 40 may include one or more program modules 42 that generally carry out the functions and/or methodologies of embodiments of the invention as described herein. Specifically, the program modules 42 may analyze a building model, locate the roof trusses and the roof truss members, identify the properties of each member and of the members relative to one another, determine if a conflict exists, and identify the member(s) involved in the conflict and provide a potential solution to the conflict. Other functionalities of the program modules 42 are described further herein such that the program modules 42 are not limited to the functions described above. Moreover, it is noted that some of the modules 42 can be implemented within the infrastructure shown in FIGS. 1-3.

In step 402, the conflict identification program 108 analyzes the model to identify the roof truss members. Based on the received model or image type, the conflict identification program 108 extracts the roof truss members from the other members and systems. In some embodiments where the model has all the members individually generated, the conflict program 108 is able to easily extract the roof truss members. Either from identifying the members first or identifying the roof truss assembly and then identifying the members within the roof truss. In instances where the model does not have each individual member created, the conflict identification program 108 analyzes the model or images to first determine which surfaces are roof trusses versus floors or walls. The conflict identification program 108 then identifies the apertures of the roof trusses and generates a roof truss assembly comprised of members to provide for the required frame to create the model.

In step 404, the conflict identification program 108 identifies the roof truss members and analyzes the internal properties of the roof truss members. Once the conflict identification program 108 has identified the roof trusses, the conflict identification program 108 is able to identify the roof truss member individually so that the conflict identification program 108 is able to extract the necessary information related to each roof truss member. In some embodiments, the conflict identification program 108 identifies the position of the roof truss members relative to each other. For example, to make sure all horizontal members are substantially parallel and that the horizontal members are substantially perpendicular to the vertical members. For roof trusses the roof truss members are substantially parallel or perpendicular unlike with roof trusses and roof trusses.

The conflict identification program 108 determines the actual values for the roof truss member properties. These properties are related to all features of the roof truss member; length, height, width, thickness of material, orientation, position, cutouts, apertures, lips, flanges, Swedge, and the like. For example, the roof truss members position relative to the x, y, and z axes. In some embodiments, the limitation of the shipping vehicles sets a maximum length of the roof truss members. In some embodiments, the limitations of the manufacturing machines are used to set the required values. For example, the thickness of the material is a limitation on the roof truss members.

In decision 406, the conflict identification program 108 determines if the roof truss member's have any internal conflicts (e.g. if the actual values of the member properties are within the range of the required values). The measured actual values are compared to the required values. This comparison assists in confirming that the roof truss members are of the proper dimensions and have the features in the proper locations so that when the roof truss is assembled the members line up, the features of the members are in the proper location, and the panel is assembled correctly. If the conflict identification program 108 determines that an actual value of any properties of the roof truss member are outside the predetermined tolerance range of the property, the conflict identification program 108 creates the sick list and adds the identified member to the sick list.

In step 408, the conflict identification program 108 creates the sick list of the roof truss members which have issues. This list may be the identification of the members within the model as highlighted or identified from the other members. In some embodiments, the sick list is a list showing the actual values, the required values, and the differences between these two values (delta) and highlight the member data to alert a user.

In step 410, the conflict identification program 108 modifies the conflicting roof truss members. Through either an automated process or the selection of a user, the conflict identification program 108 is able to modify the conflicting roof truss members to fall within the tolerance range set for each property value which is conflicting. In some embodiments, this may require performing additional modifications to the roof truss member if the modification results in other features of the roof truss member becoming problematic and conflicting with the required values. For example, if a roof truss member is shortened and thus moving the position of an aperture, the aperture position may be adjusted to accommodate the shortening of the roof truss member.

In step 412, the conflict identification program 108 analyzes the roof truss members relative to the assembled roof truss. The conflict identification program 108 analyzes the roof truss members interaction with one another. This may include members are overlapping, incorrect placement of fastening positions, incorrect member direction or orientation at connections, incorrect gaps or spacing between panels uneven height or width, are a few examples of potential internal conflicts. For example, the conflict identification program 108 may analyze the actual values of the orientation, position, length, width, and overlapping area of the top chord 902, the bottom chord 908, the end members 904, the center member 910, and the set of web members 912, 918, 914, 920, and 916 relative to one another to determine if there is any problematic overlapping or conflicts between the members. The set of web members 912, 918, 914, 920, and 916 orientation, overlap with one another and the top and bottom chords and the like are all analysed to determine the actual values for the members interactions. The location of the dimples relative on each track, and the other actual measurements of the interaction of the members. The bottom chords 908 are analyzed based on their actual overlap, their actual position, and their actual orientation relative to one another and the other members which interact with them.

In decision 414, the conflict identification program 108 determines if any of the members have external conflicts. The conflicts are based on the interaction between members of the roof truss. Based on the known requirements for the ideal interaction and a calculated value for the actual interaction between the members the conflict identification program 108 is able to determine if a conflict exists. If a conflict does exist the conflict identification program 108 creates a sick list of the external conflicts. If a conflict does not exist, the conflict identification program 108 completes the analysis.

In step 416, the conflict identification program 108 creates the sick list of the roof truss members which have issues. This list may be the identification of the members within the model as highlighted or identified from the other members. In some embodiments, the sick list is a list showing the actual values, the required values, and the differences between these two values (delta) and highlight the member data to alert a user.

In step 418, the conflict identification program 108 modifies the conflicting roof truss members. Through either an automated process or the selection of a user, the conflict identification program 108 is able to modify the conflicting roof truss members to fall within the tolerance range set for each property value which is conflicting. In some embodiments, this may require performing additional modifications to the roof truss member if the modification results in other features of the roof truss member becoming problematic and conflicting with the required values. For example, if a roof truss member is shortened and thus moving the position of an aperture, the aperture position may be adjusted to accommodate the shortening of the roof truss member.

In one embodiment, the structure is made from members formed from cold rolling steel. Each roof truss and members are screwed together to form each of the roof truss assemblies. The conflict identification program 108 analyzes each member. Such as the required overlapping length and overlapping width of each member per the location of the dimples and the number of dimples required for proper connections of the members and panels.

The conflict identification program 108 identifies the actual length, width, orientation and location of the dimples of each member through the use of global coordinates from the 3D model 800. The conflict identification program 108, through accessing the database, is able to identify the required dimple locations of each member and through a comparison of the different between the required information and the actual information. The conflict identification program 108 is able to determine if a conflict exists between the members due to the incorrect dimple locations. This technique can be used to related to the overlap of the members, the position of the members, the measurement of the members, or the like.

In another embodiment, the conflict identification program 108 may analyze the member compared to the standard Construction Tolerances set forth by the conflict identification program 108. The actual tolerance of each member determined from the 3-D model. This actual tolerance is compared to the standard construction tolerances and a delta is calculated. The required minimum tolerance of each member is determined as per the standard construction tolerances. If the delta is outside the predetermined value range, a conflict is either identified or not identified.

For example, if the program determines that the Required Dimple location and Actual Dimple Location is same, it means there is no Conflict. If the Required Dimple Location and Actual Dimple Location is not same, then there is a Conflict. If the Required Overlap length and Actual overlap length is same, it means there is no Conflict. If the Required Overlap length and Actual Overlap length are outside of the tolerance, then there is a Conflict. If the Required Overlap width and Actual overlap length is same, it means there is no Conflict. If the Required Overlap width and Actual Overlap width is not same, then there is a Conflict. If the Required Overlap Area and Actual overlap Area is same, it means there is no Conflict. If the Required Overlap Area and Actual Overlap Area is not same, then there is a Conflict.

Figure 5:
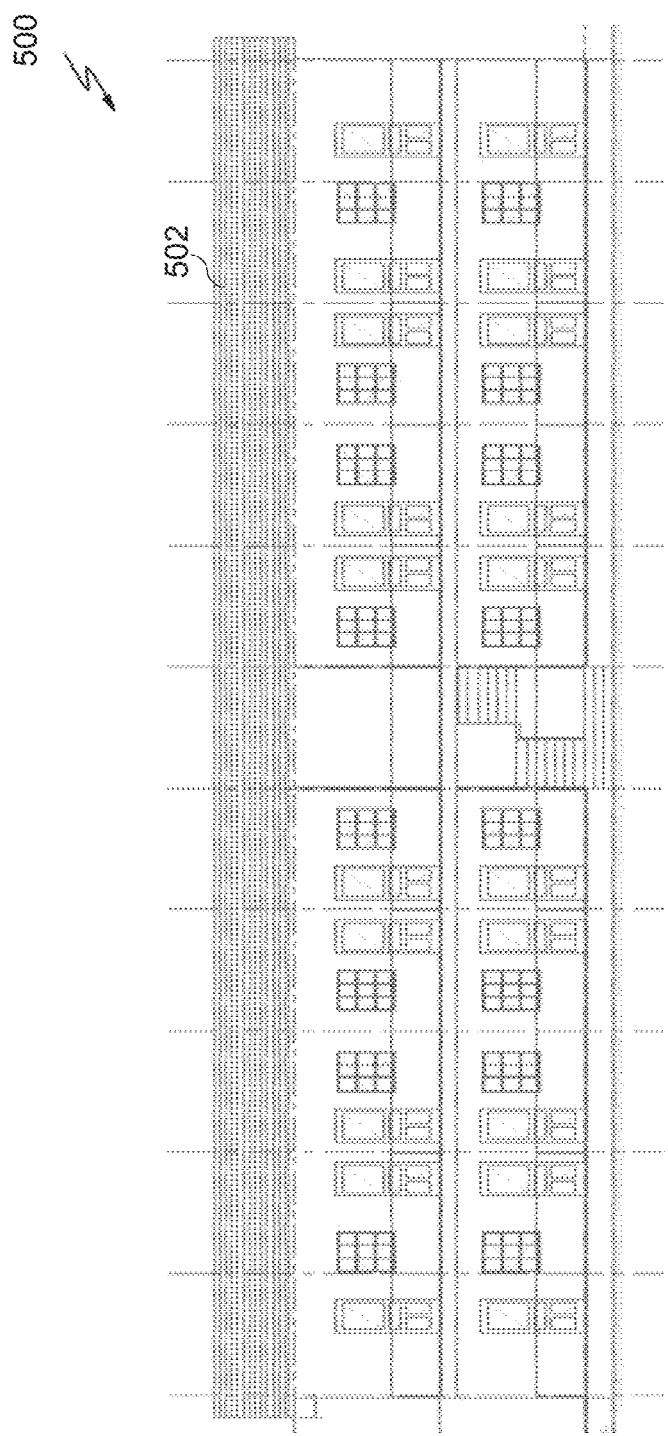
FIG. 5 depicts an architectural illustration of a front view of a structure, in accordance with one embodiment of the present invention.
Figure 6:
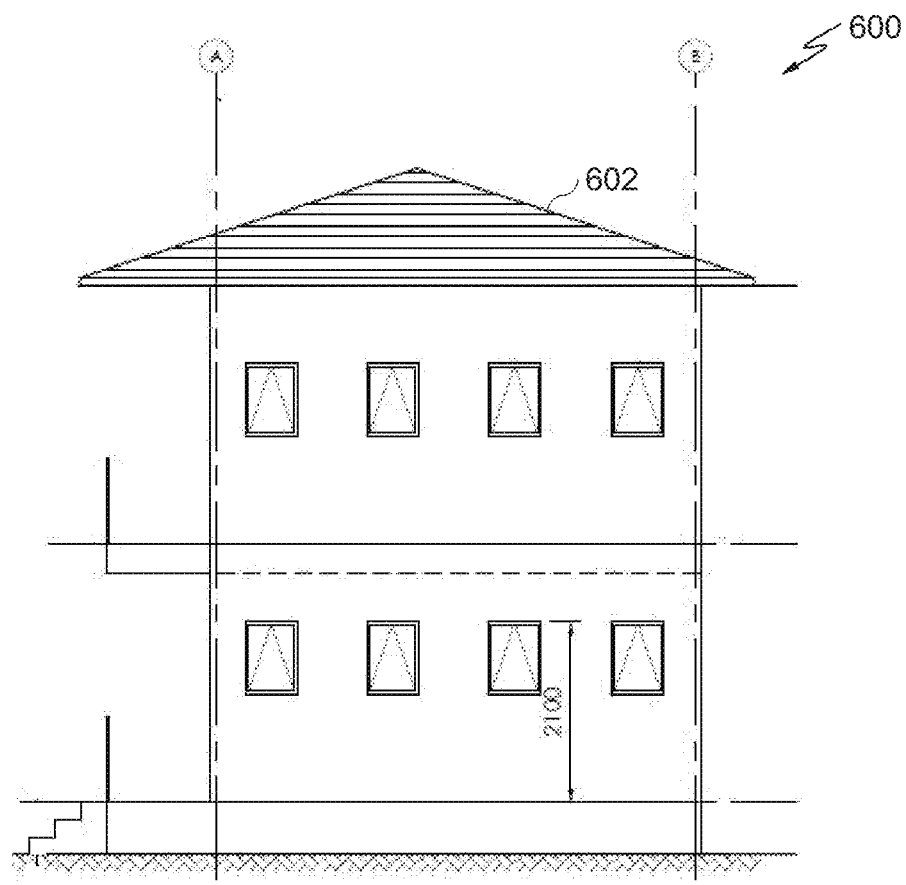
FIG. 6 depicts an architectural illustration of a profile view of a structure, in accordance with one embodiment of the present invention.
Figure 7:
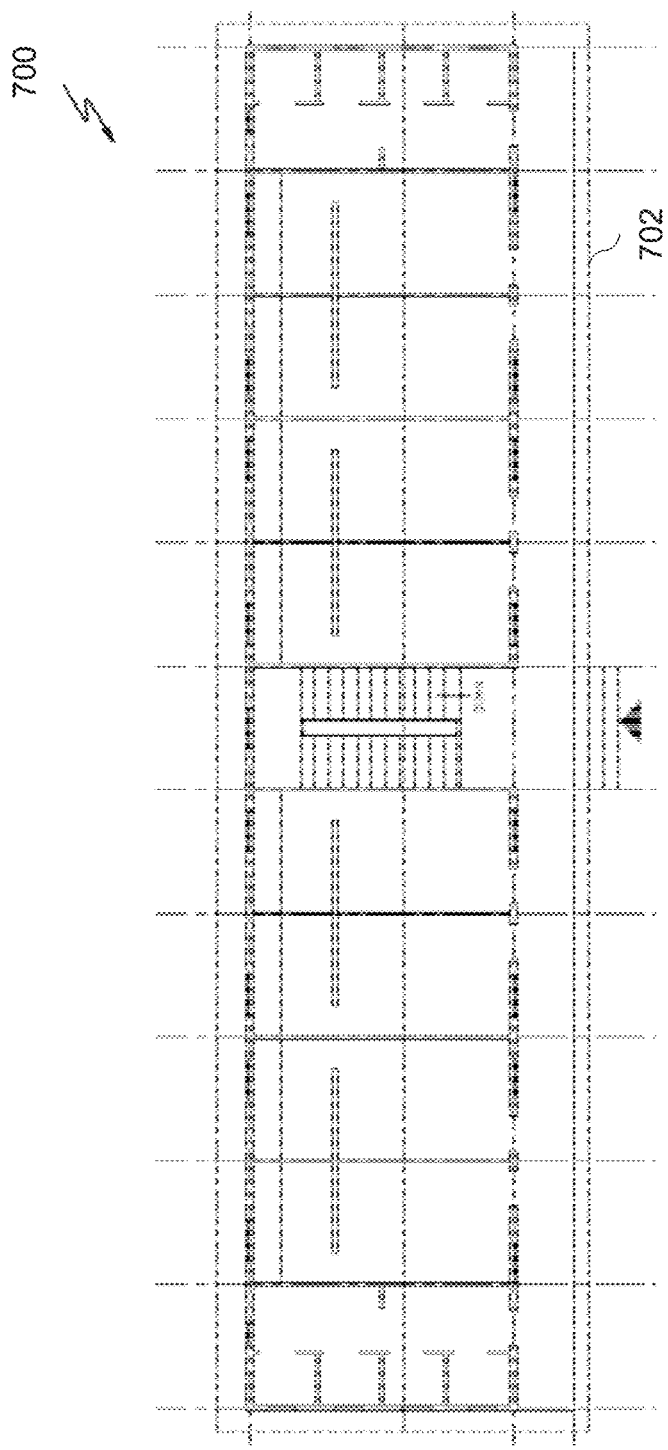
FIG. 7 depict an architectural illustration of a finished floor layout for a structure, in accordance with one embodiment of the present invention.

FIGS. 5, 6, and 7 depict various architectural illustration of a structure, in accordance with one embodiment of the present invention. The conflict identification program 108 may be provided these types of illustrations and analyses them to determine which features of the structure are the roof trusses. This determination is based on the position of the members, the identified shape of the members, the members (and orientation of the members) of the members, and the like which would distinguish the roof trusses from the other members of the building. In FIG. 5, the roof 502 is clearly shown on the top of the building. In FIG. 6, the roof 602 is clearing shown along with the overhang over the front and rear of the building. In FIG. 7 a dotted line 702 showing the outside edge of the roof is shown. This includes both internal and external roof trusses. Through the analysis of the building design, the conflict identification program 108 is able to establish a set of limits and requirements which the roof trusses and the roof truss members must adhere to. These illustrations depicted the floor plans to show walls, doors, stairs, windows, rooms, and other architectural features of each floor of the building. Based on the conflict identification program's 108 review of these drawings, the program is able to detect the overall dimensions of the roof trusses to assist in setting forth the required values and properties to which the roof truss members are analyzed.

Figure 4:
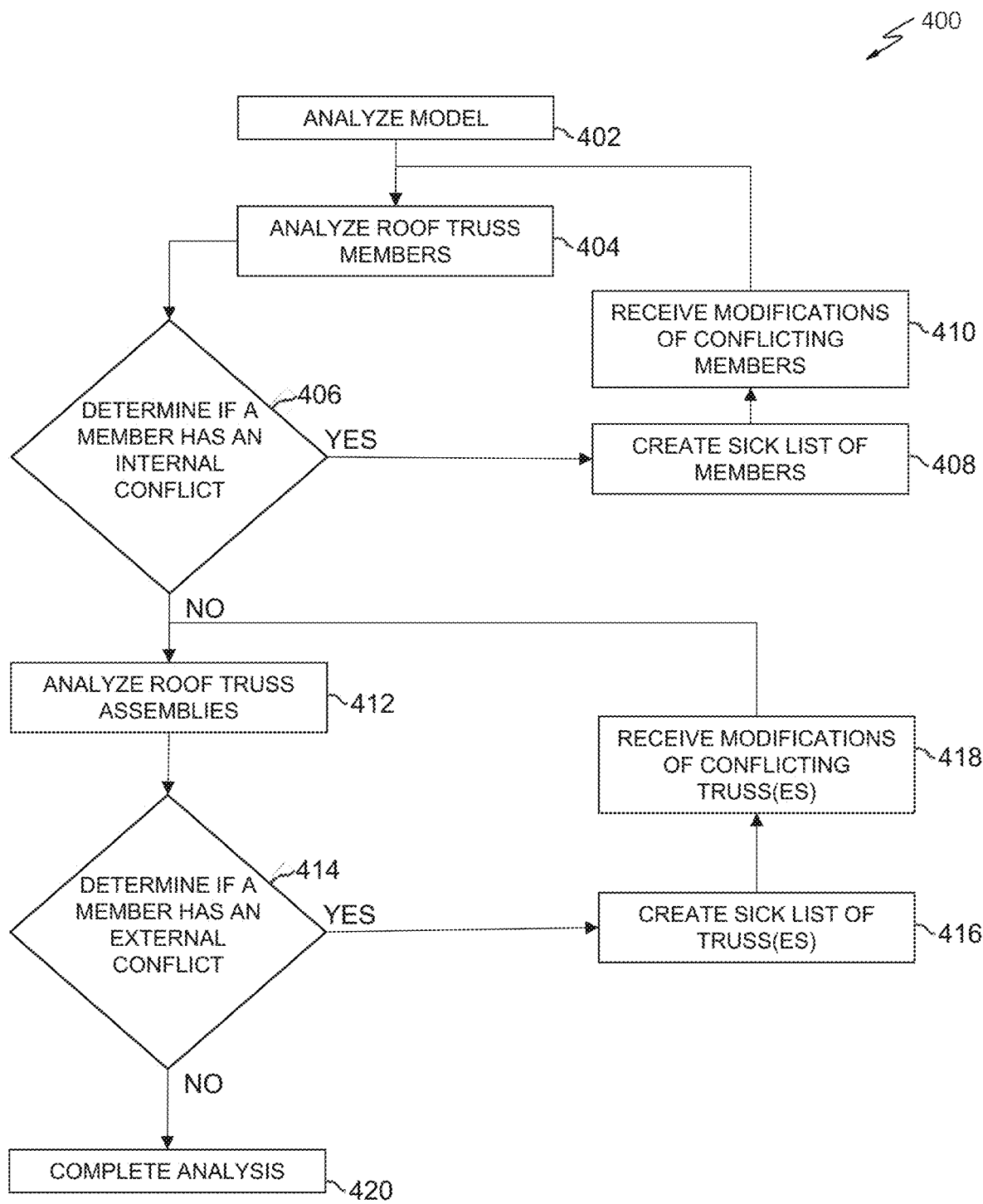
FIG. 4 depicts a flowchart of the operational steps of a method for determining the directional conflict checks for roof trusses or members in building within the computing environment of FIG. 1, in accordance with one embodiment of the present invention.
Figure 8:
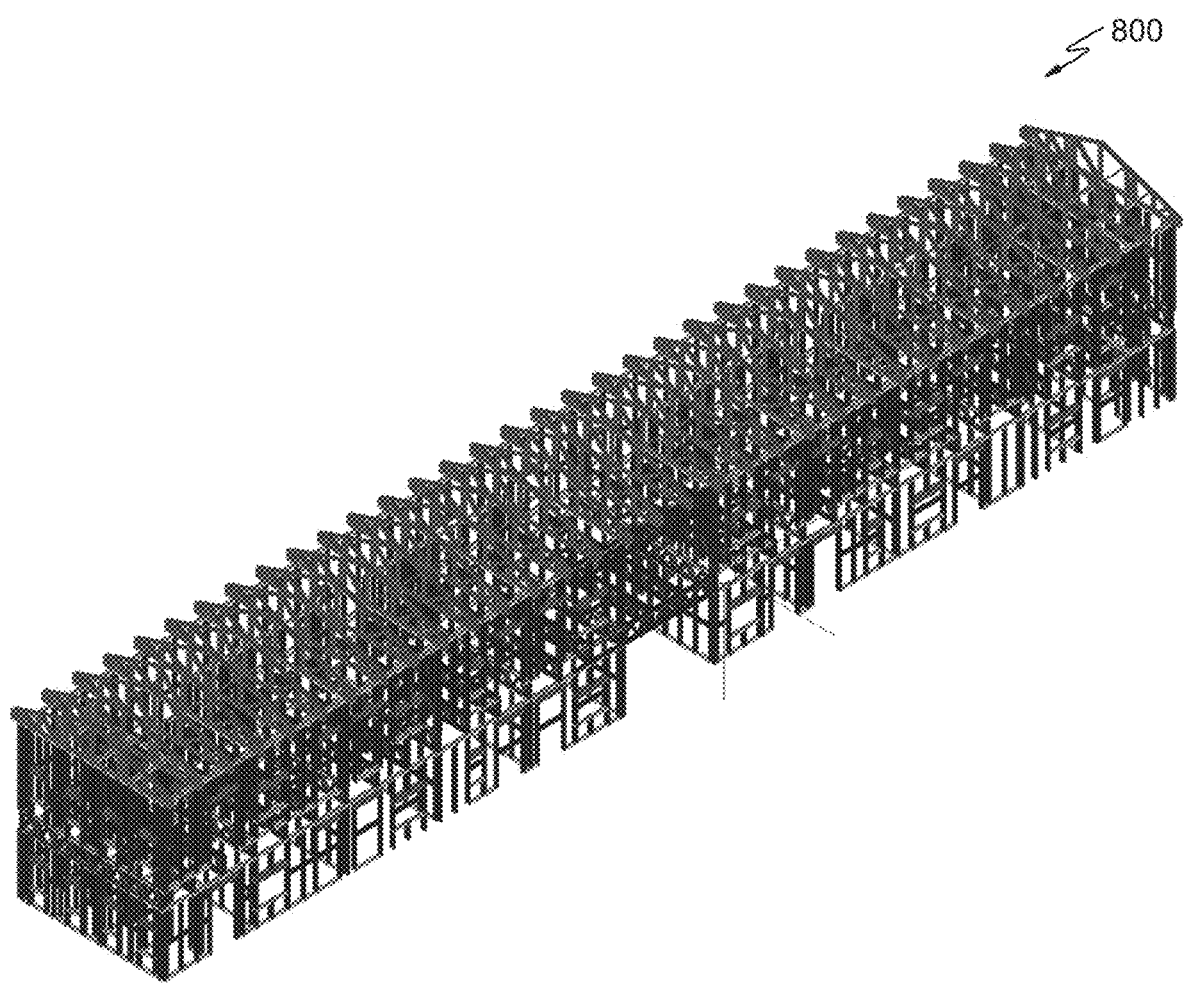
FIG. 8 depicts a 3D model of a frame of a structure, in accordance with one embodiment of the present invention.

FIG. 8 depicts a model 800 of a frame of a structure, in accordance with one embodiment of the present invention. This model provides all of the framing members including the walls, floors, and roofs. The conflict identification program 108 is able to take either the illustrations or model(s) and perform the analysis identified in FIG. 4, as the program is able to detect which members are the roof trusses (and members). In the depicted embodiment, the model depicts the structural framing members, with all the connection points for the frame members determined. This model would be analyzed for each structural wall member to determine any conflicts. If a conflict is found, that member may be highlighted or identified in a different color to allow easy visual identifies for the user to locate the conflict member.

Figure 9A:
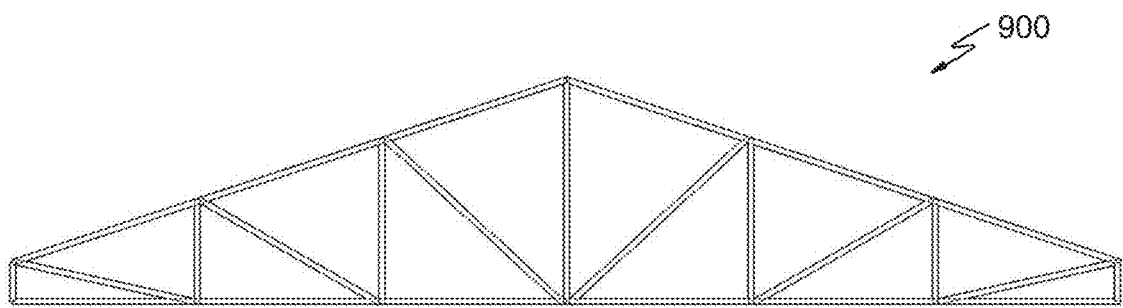
FIG. 9A depicts illustrations of an assembled roof truss, in accordance with one embodiment of the present invention.
Figure 9B:
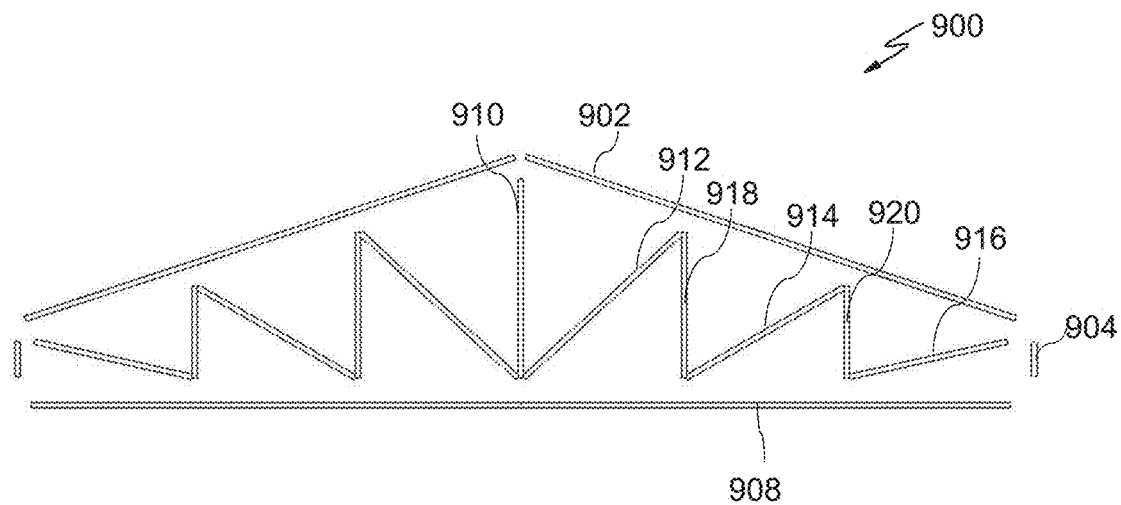
FIG. 9B depicts illustrations of an exploded roof truss, in accordance with one embodiment of the present invention.
Figure 10A:
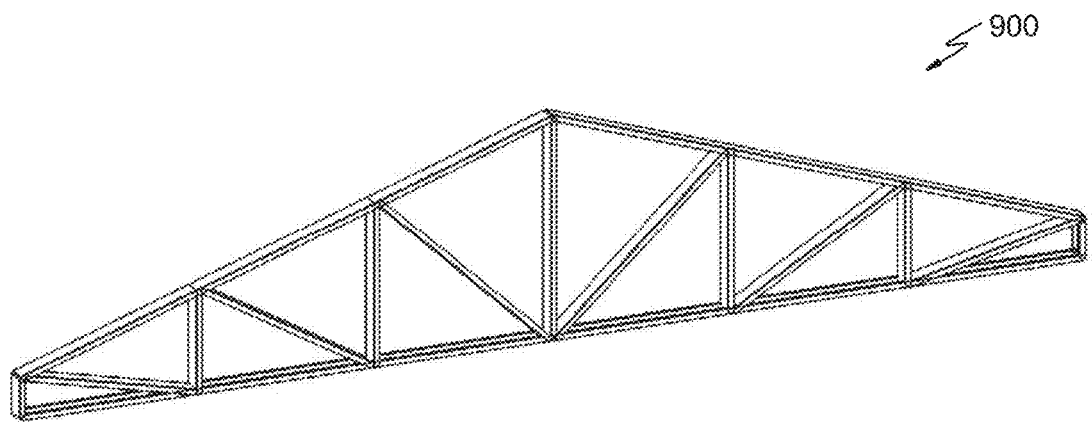
FIG. 10A depicts illustrations of an assembled roof truss 3D model, in accordance with one embodiment of the present invention.
Figure 10B:
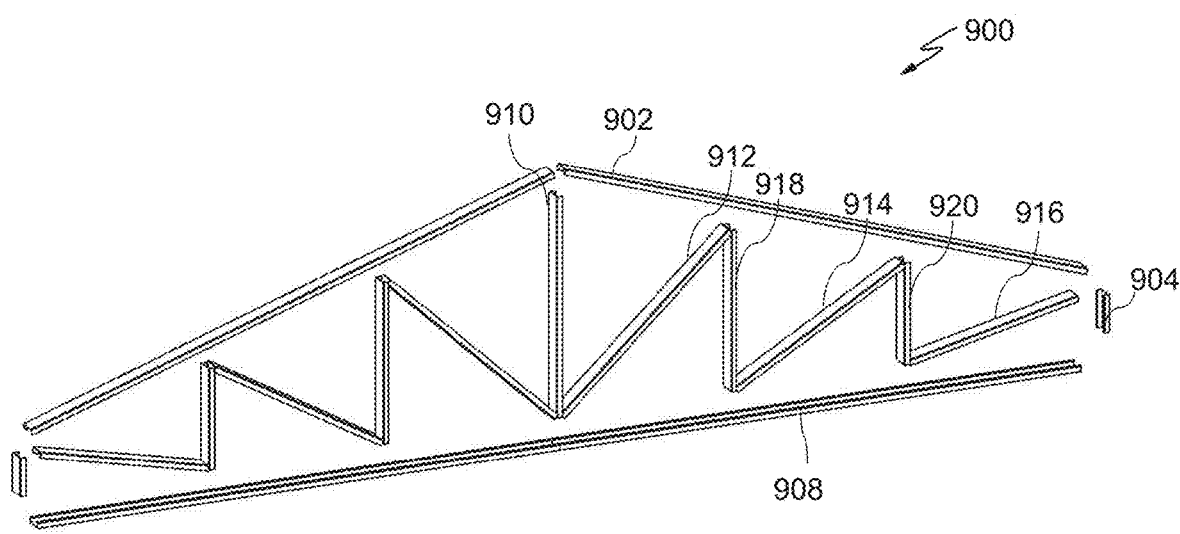
FIG. 10B depicts illustrations of an exploded roof truss 3D model, in accordance with one embodiment of the present invention.

FIGS. 9A and 9B depicts illustrations of a roof truss, in accordance with one embodiment of the present invention. FIGS. 10A, 10B depict models of a roof truss, in accordance with one embodiment of the present invention. The roof truss is comprised of a top chord 902, a bottom chord 908, an end member 904, a center member 910, and a set of web members 912, 918, 914, 920, and 916. These members are replicated over the center member 910. In the depicted embodiment, the black sections of the members depicted the overlapped portions of the members. In some embodiments, the conflict identification program 108 analyses the spacing and angles of the web members 912, 918, 914, 920, and 916 to determine if the number, orientation, and length of the web members 912, 918, 914, 920, and 916 is within the required measurements and requirements. In some embodiments, the conflict identification program 108 analyses the spacing and angles of the web members to determine if the number, orientation, and length of the web members is within the required measurements and requirements. The length of the top chord and the bottom chord. The web members to the top chord, the web members to the bottom chord, the web members to the rail members, the bottom chord overlap.

Figure 11:
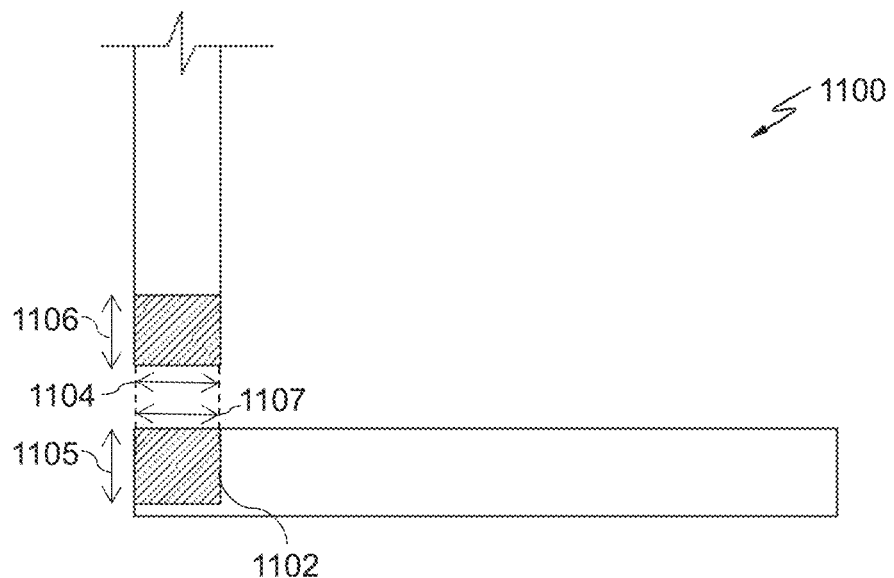
FIG. 11 depicts a close up of the intersection of members, in accordance with an embodiment of the present invention.

FIG. 11 depicts a close up of the intersection of members, in accordance with an embodiment of the present invention. The conflict identification program 108 may analyse the members for member overlap length which is required to properly construct each roof truss. Required spacing of the members and the gap 1102. For this condition gap 1102 is provided in between both members. The actual gap dimensions are taken from the measurements 1104 and 1106 and 1105 and 1107 of the members. The required measurements are taken from a known value based on the type of members and the type of overlap. If the measured and required values are compared and there is a difference between them, and is outside the tolerance, then the members are identified as conflicting.

Figures 12A, 12B:
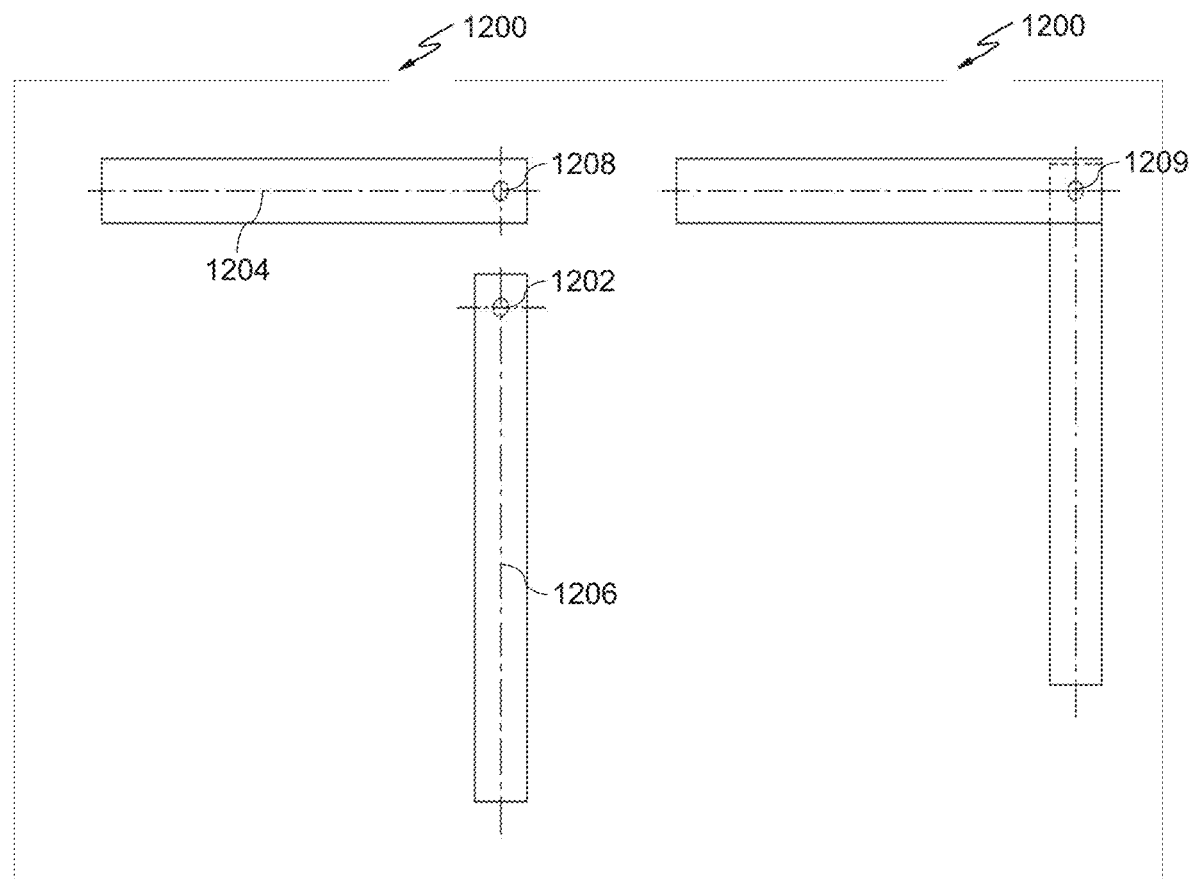
FIG. 12A depicts a close up of the intersection of members, in accordance with another embodiment of the present invention.
FIG. 12B depicts a close up of the intersection of members, in accordance with another embodiment of the present invention.

FIG. 12 depicts a close up of the intersection of members, in accordance with another embodiment of the present invention. Member Swedge is checked to get the correct location of dimples 1208 and 1202 for the screws. When two members having the same size and are connected to one another, then one member should be swedged into another member. Required Swedge is determined by the location of another member connecting to it. The location of the dimples 1202 and 1208 are obtained from the point of intersection of the centre line 1204 and 1206 of two intersecting members. Dimple should be place at the same location where the two centre lines of the members are intersecting 1209. The actual dimple location of each member is compared to the required dimple location and if there is a different in the two values then the members are added to the sick list and are identified as conflicting.

In some embodiments, roof trusses, members, or features of the members that are conflicting will be identified in red color in the model, red on the parts list, or red on the drawings.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

The foregoing descriptions of various embodiments have been presented only for purposes of illustration and description. They are not intended to be exhaustive or to limit the present invention to the forms disclosed. Accordingly, many modifications and variations of the present invention are possible in light of the above teachings will be apparent to practitioners skilled in the art. Additionally, the above disclosure is not intended to limit the present invention. In the specification and claims the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g. attached, adhered, joined) are to be construed broadly and may include intermediate members between a connection of members and relative movement between members. As such, joinder references do not necessarily infer that two members are directly connected and in fixed relation to each other. Moreover, network connection references are to be construed broadly and may include intermediate members or devices between network connections of members. As such, network connection references do not necessarily infer that two members are in direct communication with each other. In some instances, in methodologies directly or indirectly set forth herein, various steps and operations are described in one possible order of operation, but those skilled in the art will recognize that steps and operations may be rearranged, replaced or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to the embodiments outlined above, various alternatives, modifications, variations, improvements and/or substantial equivalents, whether known or that are or may be presently foreseen, may become apparent to those having at least ordinary skill in the art. Listing the steps of a method in a certain order does not constitute any limitation on the order of the steps of the method. Accordingly, the embodiments of the invention set forth above are intended to be illustrative, not limiting. Persons skilled in the art will recognize that changes may be made in form and detail without departing from the spirit and scope of the invention. Therefore, the invention is intended to embrace all known or earlier developed alternatives, modifications, variations, improvements and/or substantial equivalent.

What is claimed is:

1. A computer-implemented method comprising:
receiving, by one or more processors, a model of a building associated with required regulations, the model comprises of a plurality of assemblies, and each assembly comprise of a plurality of members;
identifying, by one or more processors, a set of assemblies related to roof trusses within the model based on characteristics associated with roof truss assemblies;
analyzing, by the one or more processors, each of the plurality of members of the roof truss assemblies for external conflict and internal conflict; wherein the external conflict is related to the interaction between members of the assembly and the internal conflict is related to the properties of the of the roof truss members;
identifying external conflict and internal conflict further include
analyzing, by the one or more processors, each of the plurality of members for member-to-member conflicts;
analyzing, by the one or more processors, each of the plurality of assemblies that has not member-to-member conflict for assembly-to-assembly conflicts, wherein an assembly-to-assembly conflict involve at least one member of each of a roof truss assembly with a member of another assembly;

analyzing, by the one or more processors, the members of the assemblies involved in the assembly-to-assembly conflicts;

identifying, by the one or more processors, each of the members involved in the at least one of member-to-member conflict and assembly-to-assembly conflict as conflicting members, wherein each the identified conflicting members are marked in the model;

analyzing, by the one or more processors, each of the member of the plurality of roof truss assemblies that are identified as non-conflicting members with mating assemblies or mating members for mating conflicts; wherein the mating conflict is determined when the assemblies and individual member are not properly mated based on required tolerance and bearing area which thereby results in an unsafe building;

generating, by the one or more processors, a list of all the members involved in the at least one of member-to-member conflict, assembly-to-assembly conflict and mating conflicts that are associated with roof truss assemblies;

determining, by the one or more processors, a solution to correct the members involved in the at least one of member-to-member conflict, assembly-to-assembly conflict and mating conflicts by using a machine learning algorithm; and implementing the solution into the model to conform the required regulations.

2. The computer-implemented method of claim 1, further comprising, marking, by the one or more processors, the members involved in the at least one of member-to-member conflict, assembly-to-assembly conflict and mating conflicts, wherein the conflicting members are distinguished from non-conflicting members.

3. The computer-implemented method of claim 1, further comprising, integrating, by the one or more processors, a sub-system into the model, wherein the sub system interfaces with at least one roof truss assembly.

4. The computer implemented method of claim 3, further comprising, analyzing, by the one or more processors, the plurality of members which interact with the installation of the sub-system, and determining if at least one of the plurality of member conflicts with the sub-system.

5. The computer-implemented method of claim 4, further comprising, modifying, by the one or more processors, the at least one of the plurality of members which conflict with the sub-system.

6. A computer program product, the computer program product comprising a non-transitory computer readable storage medium having program instructions embodied therewith, the program instructions executable to cause the computing device to:

receive a model of a building associated with required regulations, wherein the model comprise a plurality of assemblies and each assembly comprise a plurality of members;

identify the assemblies associated with the roof truss s, and analyze the members individually and each of the members related to the respective roof truss assembly, wherein the analysis compares an actual location of the members and the roof truss roof truss assemblies from measurement to a required location of the members and the roof truss assemblies;

analyze each of the plurality of members of the roof truss assemblies for external conflict and internal conflict;

wherein the external conflict is related to the interaction between members of the assembly and the internal conflict is related to the properties of the of the roof truss members;

identify external conflict and internal conflict further include;

analyze each of the plurality of members for member-to-member conflicts;

analyze each of the plurality of assemblies that has not member-to-member conflict for assembly-to-assembly conflicts, wherein an assembly-to-assembly conflict involve at least one member of each of a roof truss assembly with a member of another assembly;

mark each of the members involved in the identified external conflict and internal conflict as conflicting members;

analyze each of the member of the plurality of roof truss assemblies that are identified as non-conflicting members with mating roof truss assemblies or mating members for mating conflicts; wherein the mating conflict is determined when the roof truss assemblies and individual member are not properly mate based on required tolerance and bearing area which thereby results in an unsafe building;

generate a list of all conflicting members;

determining a solution to correct the at least one conflicting member based on a machine learning algorithm, wherein the conflict members are adjusted to adhere to the required location; and implement the solution into the model to conform the required regulations.

7. The computer program product of claim 6, further comprising, analyze an interface between at least two assemblies, wherein one of the assemblies is a roof truss assembly.

8. The computer program product of claim 6, further comprising, analyze the model and at least one sub-system, wherein each sub-system has a set of components and determining if a member of a roof truss assembly conflict with any of the components of the sub-system.

9. The computer program product of claim 6, further comprising, assessing an interface between the sets of assemblies, wherein it is determined if any assemblies conflict with a roof truss assembly, and if a conflict is discovered identifying the members of the assemblies which are conflicting.

10. The computer program product of claim 9, further comprising, determining if the members of the conflicting assemblies are to be adjusted or if the assembly is to be adjusted, and adjusting the members or the assembly.

11. A system comprising:

a processor, a computer readable memory and a non-transitory computer readable storage medium associated with a computing device;

program instructions to identify a plurality of members and a plurality of assemblies of a model of a building associated with required regulations, wherein each assembly comprise of a set of members;

program instructions to identify roof truss assemblies based on a specific set of characteristics associated with the roof truss assemblies;

program instructions to analyze each member of the model and determine if any members have an external conflict and internal conflict, wherein the external conflict is related to the interaction between members of the assembly and the internal conflict is related to the properties of the of the roof truss members;

identifying external conflict and internal conflict further include
- analyze each of the plurality of members for member-to-member conflicts;
- analyze each of the plurality of assemblies that has not member-to-member conflict for assembly-to-assembly conflicts, wherein an assembly-to-assembly conflict involve at least one member of each of a roof truss assembly with a member of another assembly;

program instructions to analyze each member of the assemblies that are identified as non-conflicting members with mating assemblies or mating members for mating conflicts; wherein the mating conflict is determined when the assemblies and individual member are not properly mate based on required tolerance and bearing area which thereby results in an unsafe building;

program instructions to mark the conflicting members, and assemblies, which are involved in the external conflict, internal conflict and mating conflict;

program instructions to generate a list of members and assemblies that are associated with the external conflict, internal conflict and mating conflicts;

program instructions to determine a solution to correct the members involved in the external conflict or internal conflict or mating conflicts by using a machine learning algorithm;

program instructions to implement the solution into the model to conform the required regulations; and program instructions to generate a report of the of conflicting members and the types of conflicts which resolved.

12. The system of claim 11, further comprising, program instructions to incorporating sub-systems into the model and analyzing the members to determine if they conflict with the sub-system.

13. 11, further comprising, program instructions to identify, roof truss assemblies within the model, wherein the roof truss assemblies are comprised of at least two members.

14. 11, further comprising, program instructions to identify, web cuts within the members of the roof truss assemblies for conflicts and differences between the required regulations and the model values.

* * * * *